(12) United States Patent
Erickson et al.

(10) Patent No.: US 8,617,939 B2
(45) Date of Patent: Dec. 31, 2013

(54) ENHANCED THIN FILM FIELD EFFECT TRANSISTOR INTEGRATION INTO BACK END OF LINE

(75) Inventors: Karl R. Erickson, Rochester, MN (US); Phil C. Paone, Rochester, MN (US); David P. Paulsen, Dodge Center, MN (US); John E. Sheets, II, Zumbrota, MN (US); Gregory J. Uhlmann, Rochester, MN (US); Kelly L. Williams, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 414 days.

(21) Appl. No.: 12/950,013

(22) Filed: Nov. 19, 2010

(65) Prior Publication Data

US 2012/0126330 A1   May 24, 2012

(51) Int. Cl.
  *H01L 21/00*   (2006.01)
(52) U.S. Cl.
  USPC ........... 438/149; 438/151; 438/157; 438/166; 257/213; 257/66

(58) Field of Classification Search
  USPC .................................................. 438/369, 149
  See application file for complete search history.

(56) References Cited

U.S. PATENT DOCUMENTS

| 2005/0164462 A1* | 7/2005 | Kim ............................... 438/307 |
| 2007/0194450 A1* | 8/2007 | Tyberg et al. ................. 257/751 |
| 2009/0001466 A1* | 1/2009 | Yang et al. .................... 257/347 |

FOREIGN PATENT DOCUMENTS

JP        2006086530 A  *  3/2006

* cited by examiner

*Primary Examiner* — Ajay K Arora
(74) *Attorney, Agent, or Firm* — Robert R. Williams

(57) ABSTRACT

A semiconductor chip has self aligned (where a gate electrode and associated spacers define the source/drain implant with respect to the gate electrode) Field Effect Transistors (FETs) in a back end of the line (BEOL) portion of the semiconductor chip. The FETs are used to make buffer circuits in the BEOL to improve delay and signal integrity of long signal paths on the semiconductor chip.

5 Claims, 13 Drawing Sheets

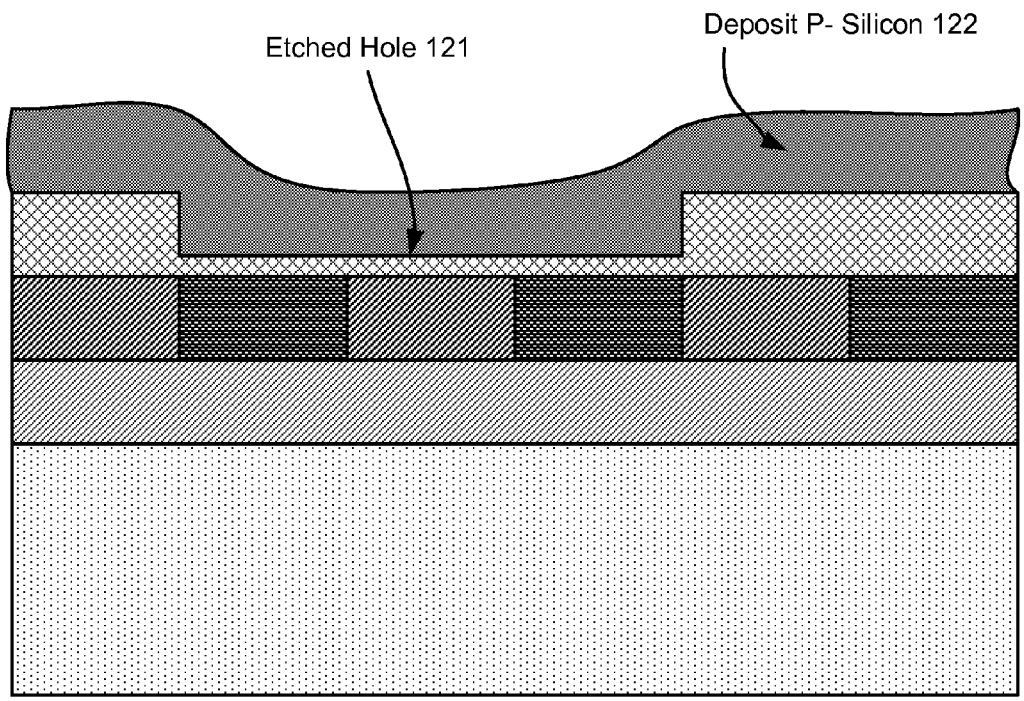
Deposit P- Silicon    Fig. 3C
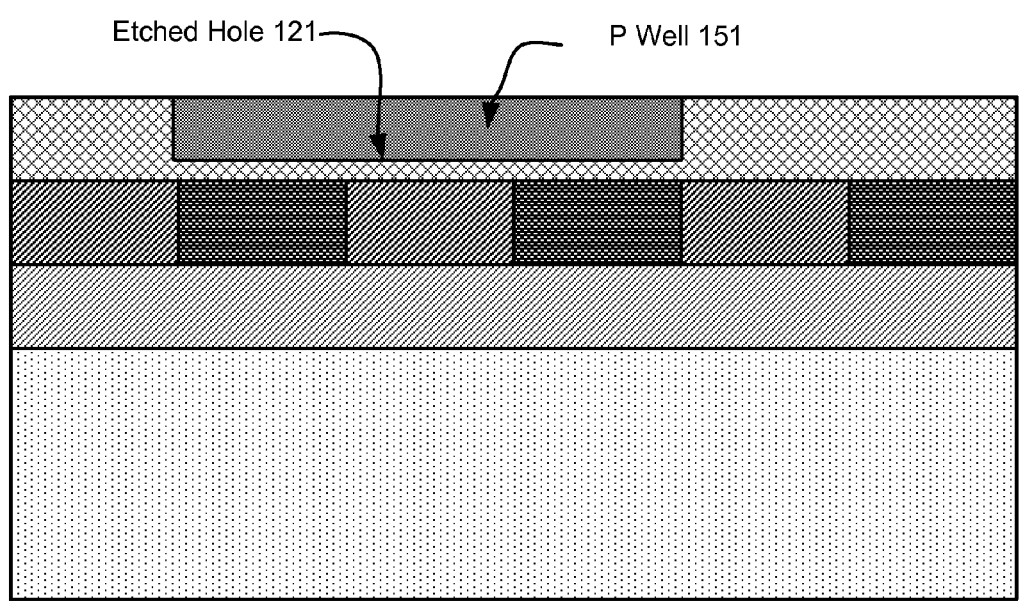
Planarize    Fig. 3D

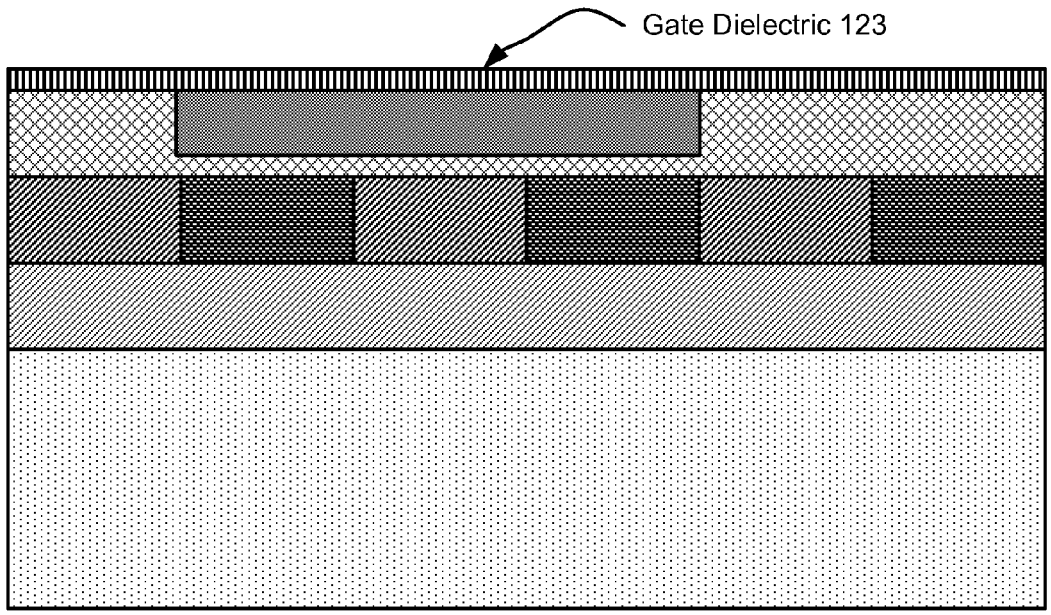
Deposite Gate Dielectrric  Fig. 3E
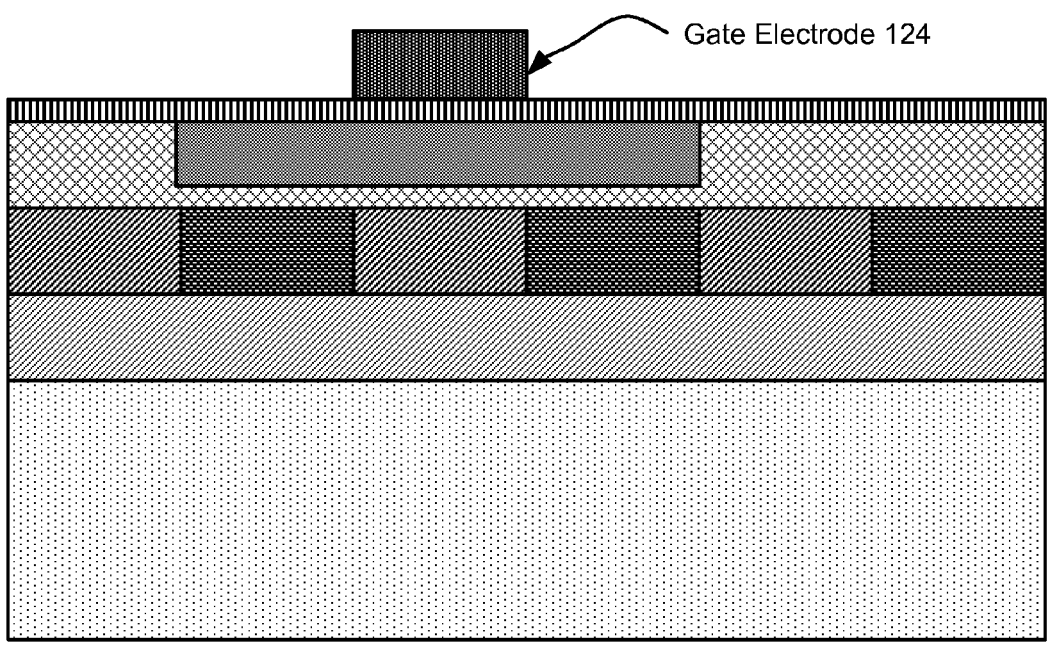
Create Gate Electrode  Fig. 3F

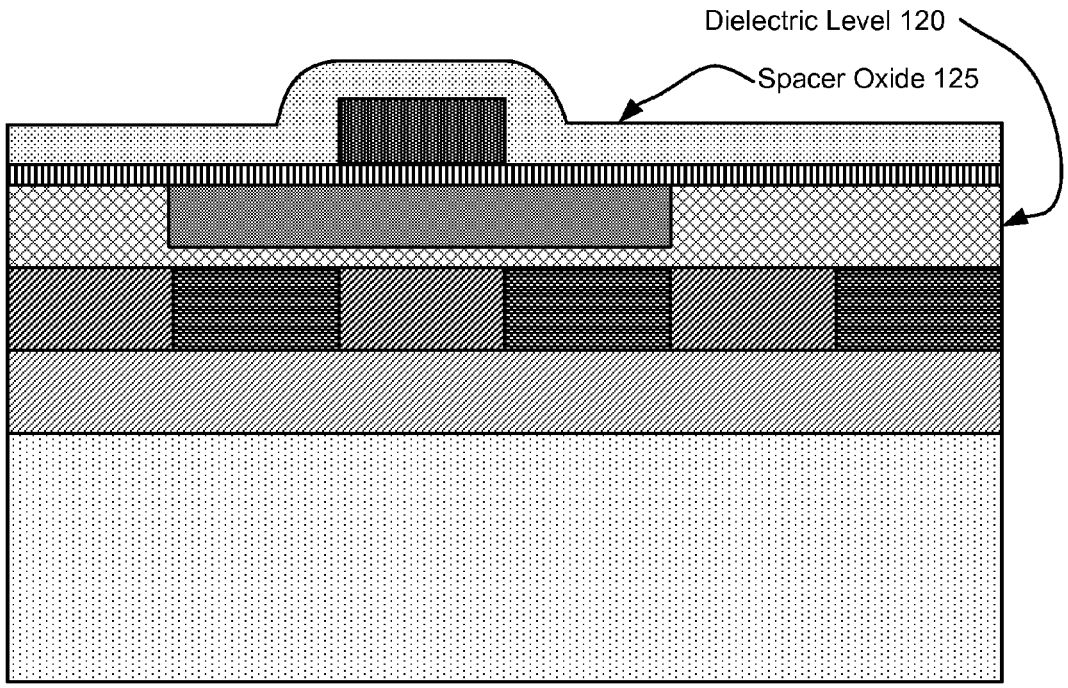
Conformal Desposition of Spacer Oxide    Fig. 3G
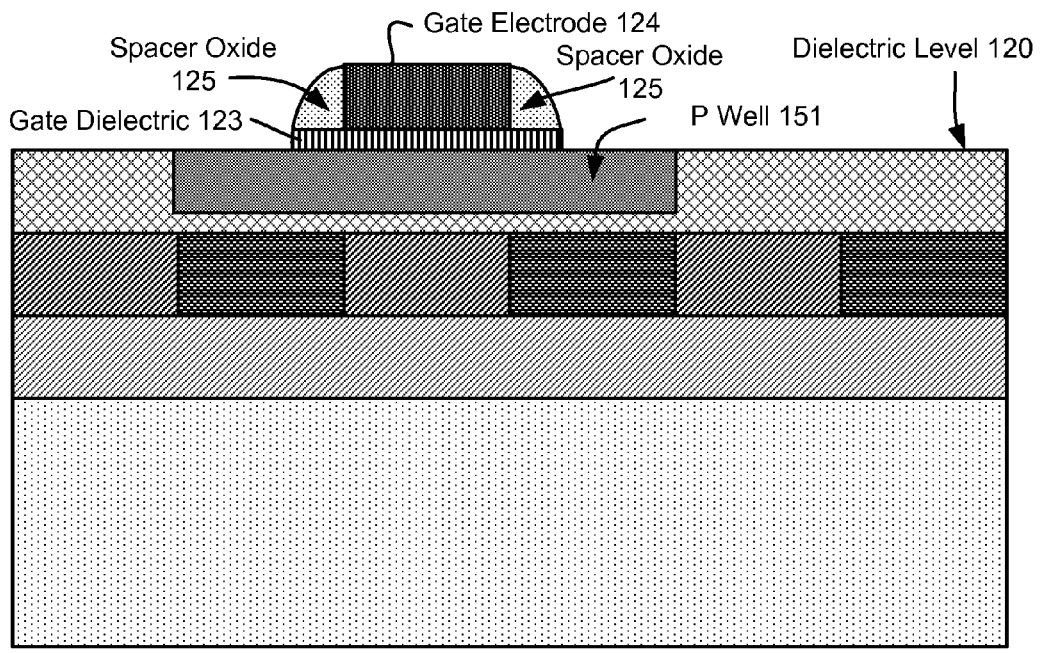
Anisotropically Etch Spacer and Gate Dielectrics    Fig. 3H

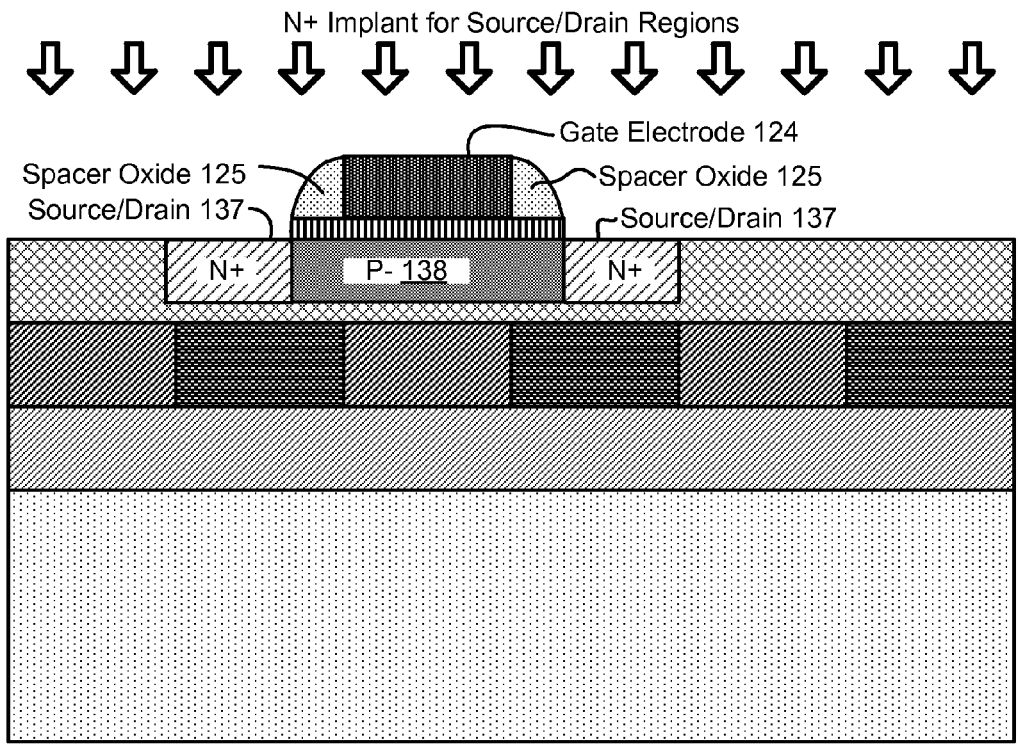
Fig. 3I
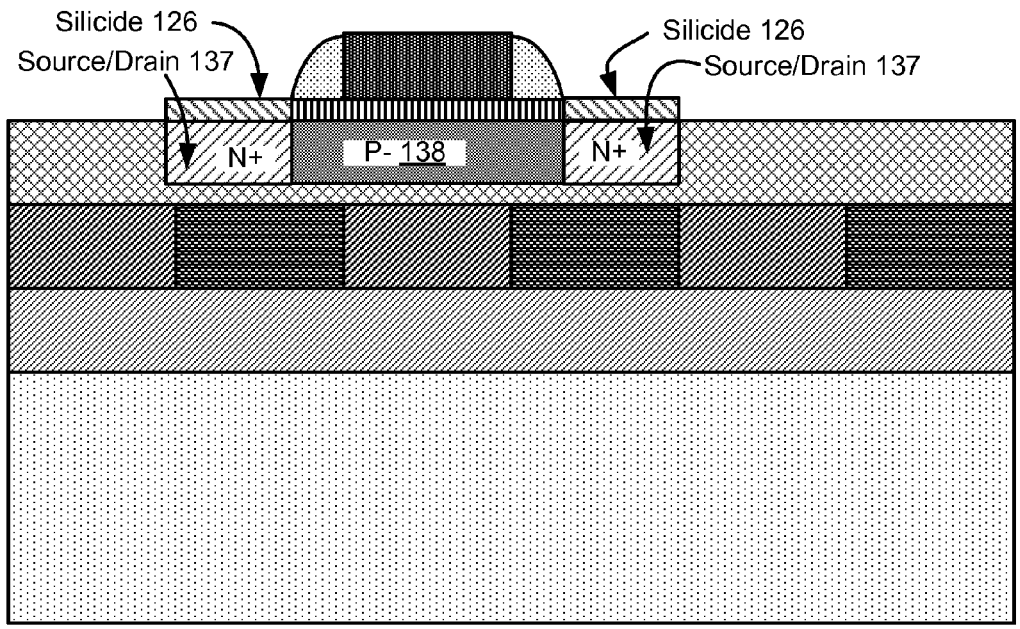
Grow Silicide   Fig. 3J

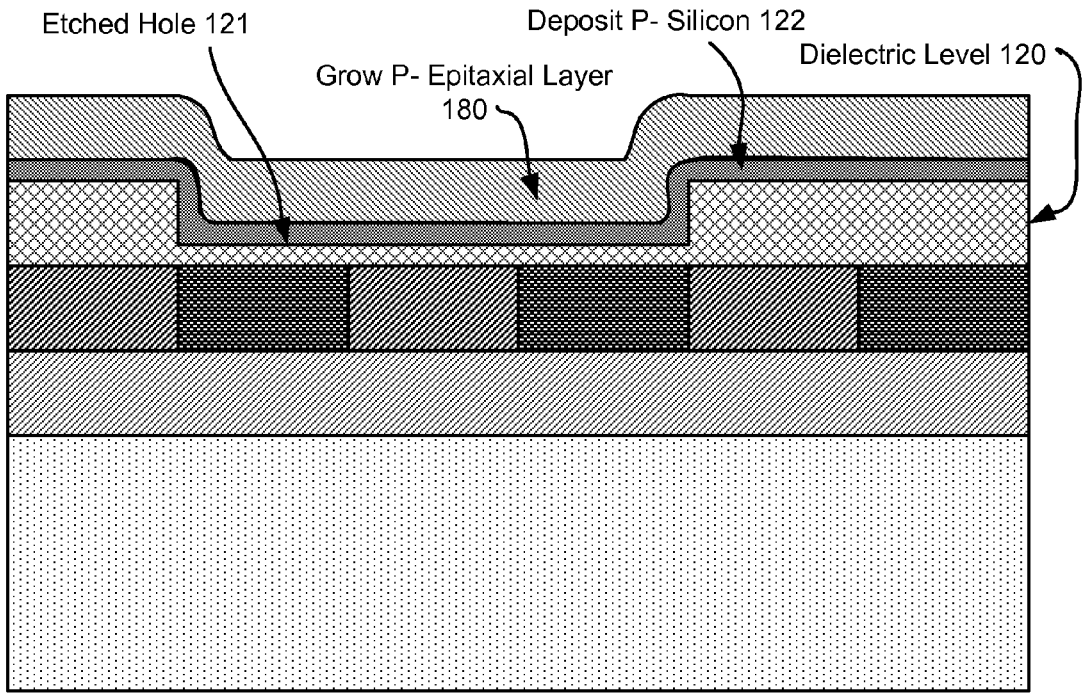
Fig. 3M
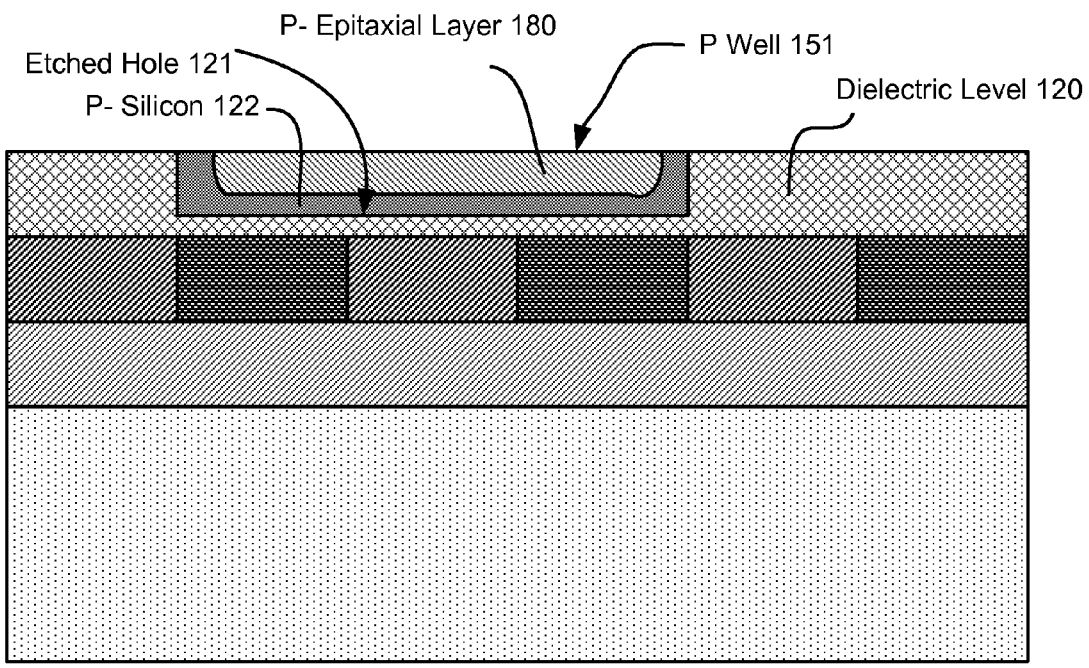
Planarize    Fig. 3N

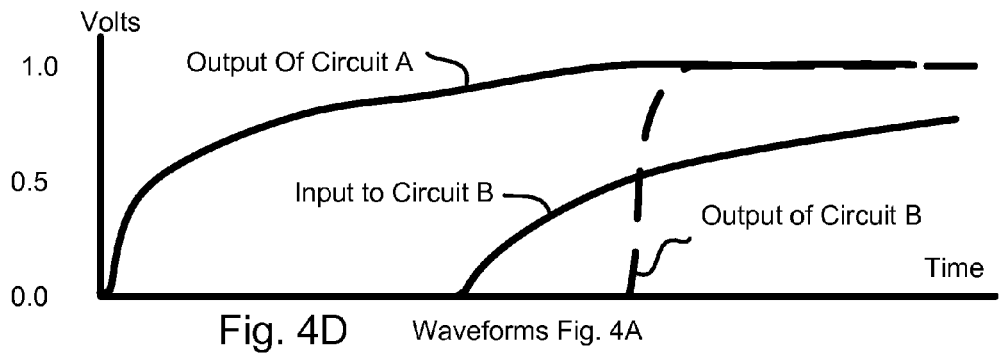
Fig. 4D    Waveforms Fig. 4A
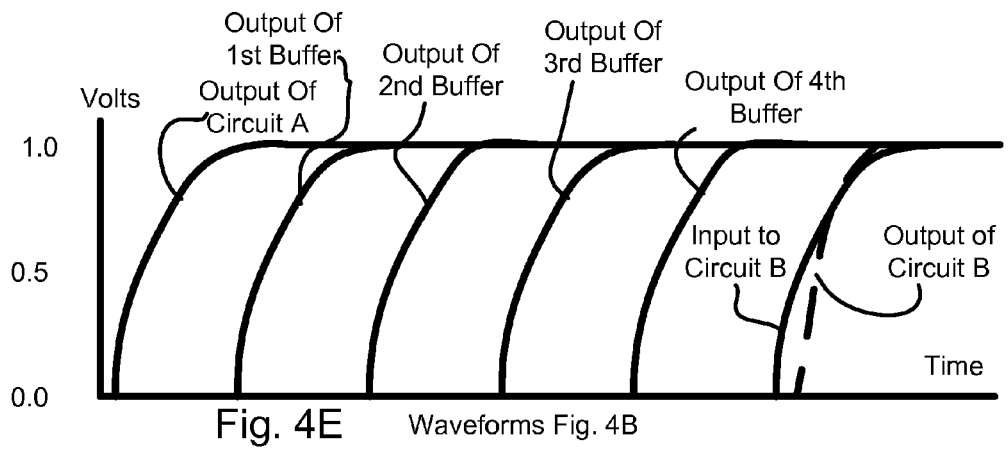
Fig. 4E    Waveforms Fig. 4B
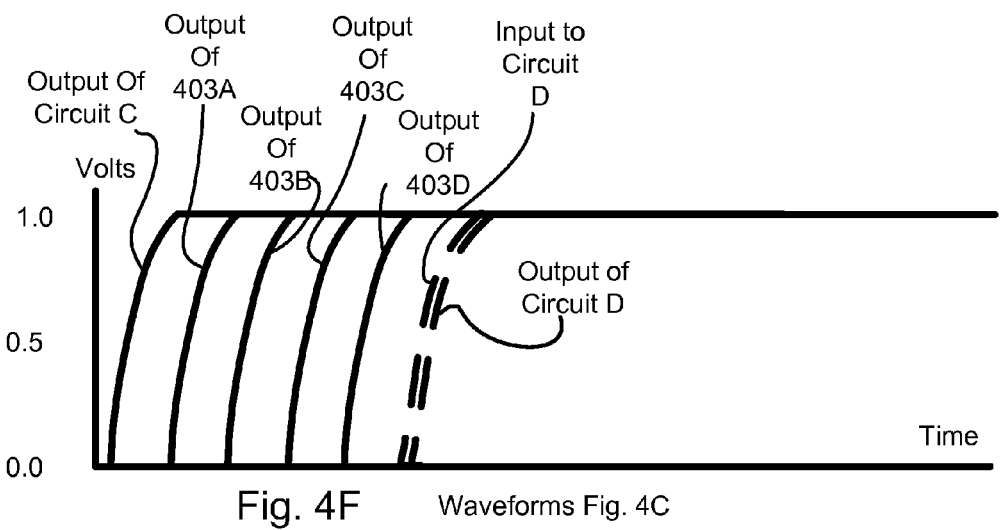
Fig. 4F    Waveforms Fig. 4C

ENHANCED THIN FILM FIELD EFFECT TRANSISTOR INTEGRATION INTO BACK END OF LINE

FIELD OF THE INVENTION

This invention relates generally to semiconductor chips, and more specifically to creation of Field Effect Transistors (FETs) in a back end of line (BEOL) on a semiconductor chip.

SUMMARY OF EMBODIMENTS OF THE INVENTION

Modern semiconductor chips, operating at very high frequencies, often have signal paths that have to drive significantly long distances from a first circuit to a second circuit on the chip. Unfortunately, chip wiring is quite resistive as well as capacitive, and therefore long chip signal routing may cause unacceptable delays and signal degradation. To reduce effects of the resistive and capacitive effects, long signal paths are often broken up into segments, with buffers (inverting or non-inverting) between segments. Long wiring routes are typically done on relatively "high" (that is, many wiring levels above the chip silicon substrate) wiring levels. Via stacks route wiring segments up to the high wiring level and back down again to buffers (or a destination circuit) on the silicon substrate. Via stacks are quite resistive and create delays in buffered, segmented, long signal routes.

In an embodiment of the present invention, self aligned FETs are created in a back end of the line (BEOL) portion of a semiconductor chip. A self aligned FET uses a gate electrode and any spacer oxide associated with the gate electrode, to mask a source/drain implant. Such self alignment dramatically reduces gate to drain overlap capacitance which is important for high performance FETs.

In an embodiment of the invention, one or more buffers are created in the BEOL using the self aligned FETs (e.g., an N channel FET (NFET) and a P channel FET (PFET)) to make buffers in the BEOL. The buffers may be inverting buffers or non-inverting buffers.

BRIEF DESCRIPTION OF THE DRAWINGS

FIG. 4D shows example waveforms of the circuitry of FIG. 4A, including an output of the first circuit, an input to the second circuit, and an output of the second circuit.

FIG. 4E shows example waveforms of the circuitry of FIG. 4B, including the output of the first circuit, outputs of buffer circuits, and the output of the second circuit.

FIG. 4F shows example waveforms of the circuitry of FIG. 4C, including the output of a first circuit, outputs of buffer circuits, and an output of a second circuit.

DETAILED DESCRIPTION OF THE EMBODIMENTS

In the following detailed description of embodiments of the invention, reference is made to the accompanying drawings, which form a part hereof, and within which are shown by way of illustration specific embodiments by which the invention may be practiced. It is to be understood that other embodiments may be utilized and structural changes may be made without departing from the scope of the invention.

Embodiments of the present invention provide for improved buffering for a signal that must travel a significant distance across a modern semiconductor chip.

Signals on modern semiconductor chips that must travel relatively long distances, such as a millimeter or more, are becoming performance limiting factors as data processing circuitry on the chips becomes faster. Signal wiring on chips tends to be quite resistive, with distributed capacitance, as well as what is typically a lumped capacitive load at the receiving end of the signal wiring. Signals are both delayed and degraded when travelling along such a resistive-capacitive signal wire. The usual technique to minimize total signal delay on a long route has been to buffer the signal one or more times along the route. Modern semiconductor chips may have twelve (or more) wiring levels above the silicon substrate. Vias to take a signal up (and back down) twelve or more wiring levels amounts to a large resistance, since vias are relatively resistive.

In an exemplary technology, a signal wire on an $8^{th}$ level wiring level may be, with worst case process conditions, 0.3 ohms/micron. A 500 micron signal wire would therefore have 150 ohms of resistance. A via between wiring levels might be, worst case, 34 ohms. Typically, redundant vias are used; e.g., four vias between the wider wires on higher-up wiring levels and two vias between the narrower wires on wiring levels nearer the silicon substrate. Contacts to the silicon levels may be 400 ohms and are typically two contact redundant. A via stack up to the $8^{th}$ level may be as much as approximately 400 ohms, which is larger than the 150 ohms of the 500 micron signal wire. Then, to get back down to a buffer circuit is another 400 ohms. Buffers placed near the $8^{th}$ level (again using the $8^{th}$ level only for example) would reduce the resistance by 800 ohms. Longer wiring routes on the $8^{th}$ level could be used for the same total resistance, or, resistance between buffers can be dramatically reduced by placing buffers near the $8^{th}$ wiring level.

US 2007/0194450, "BEOL Compatible FET Structures", Tyberg et al, and assigned to the present assignee, teaches of creation of Field Effect Transistors (FETs) in the Back End Of Line (BEOL), which is a global wiring region, comprising alternating dielectric levels and wiring levels. Tyberg creates FETs that are not self aligned FETs which provide for lower gate to source and gate to drain overlaps.

Figure 1:
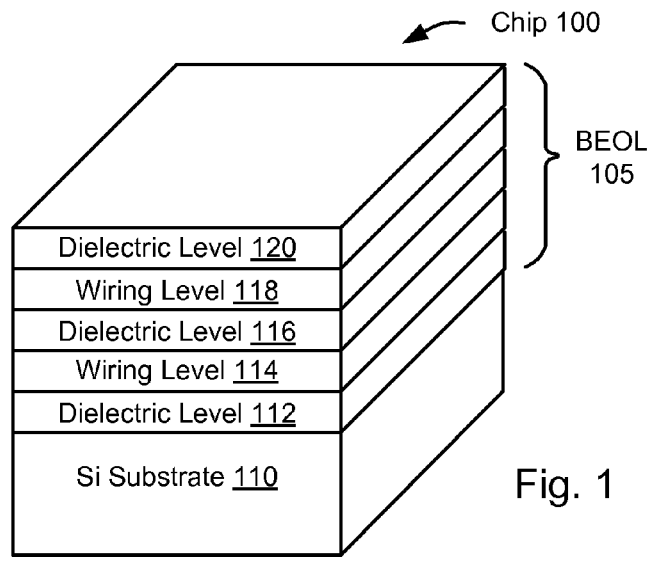
FIG. 1 shows a semiconductor chip having a silicon substrate and a plurality of dielectric levels and wiring levels, the plurality of dielectric levels and wiring levels forming a global wiring region.

FIG. 1 shows, a semiconductor chip 100 further comprising a silicon substrate 110, typically doped P−, and a BEOL 105 further comprising a plurality of dielectric levels (112, 116, 120) and a plurality of wiring levels (114, 118) sandwiched in between the dielectric levels. Although only three dielectric levels and two wiring levels are shown for simplicity, it will be understood that modern semiconductor chips may have twelve or more wiring levels.

Figure 2:
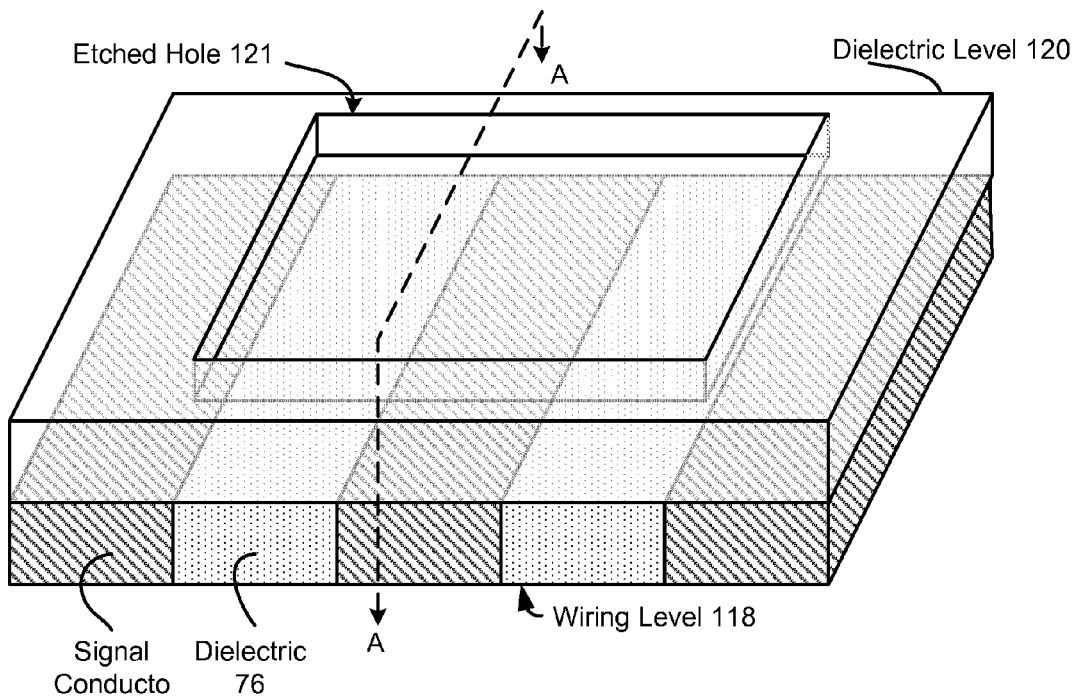
FIG. 2 shows an isometric view of a wiring level of the semiconductor chip, a dielectric level, and a hole partway through the dielectric level. A cross section line indicates a cross section used in subsequent figures.

FIG. 2 is an isometric figure that shows wiring level 118 having signal conductors 75 which may be aluminum or copper, for example, with the signal conductors separated by dielectric material 76 which may be silicon dioxide or a low-K dielectric, depending on a particular process selected for fabricating the silicon chip. FIG. 2 also shows etched hole 121 in dielectric level 120. Etched hole 121 may be a timed etch, and etched hole 121 reaches only part way through dielectric level 120. FIG. 2 also shows a cross section AA which is used in subsequent drawings to illustrate processing according to embodiments of the invention.

Figure 3A:
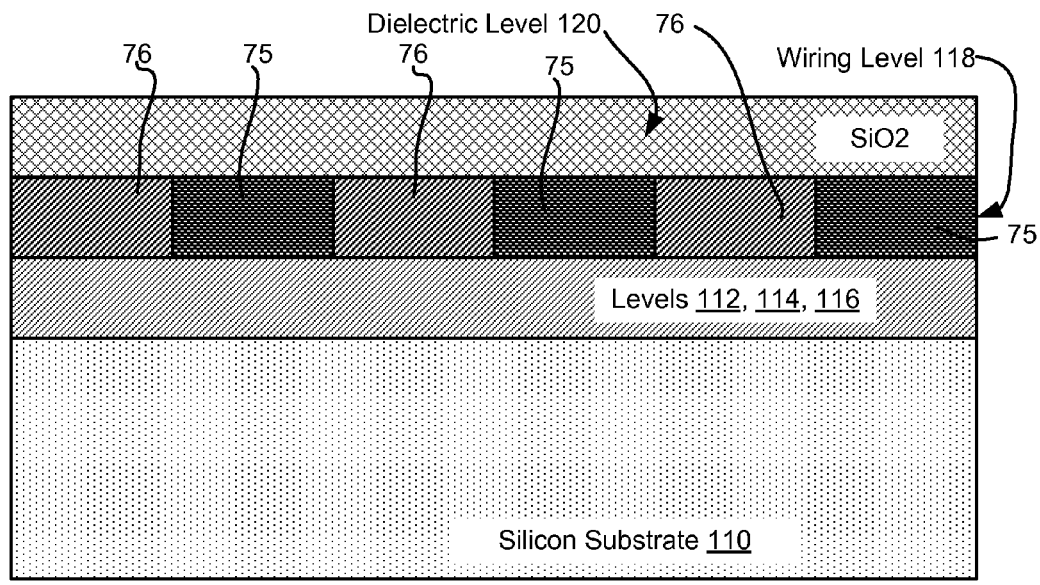
FIGS. 3A-3N shows key processing steps of embodiments of the invention.

FIG. 3A shows a cross section through AA (FIG. 2) of semiconductor chip 100, comprising silicon substrate 110, and a selected number of dielectric and wiring levels (shown for exemplary purposes as dielectric or wiring levels 112, 114, 116). Wiring level 118 shows signal conductors 75 and dielectric 76 which may be SiO2 or may be a low-K dielectric or other dielectric in variations of process for a particular semiconductor chip) between the signal conductors 75. Dielectric level 120 is shown made of SiO2, but may also be another dielectric material compatible with the semiconductor fabrication process. Signal conductors 75 are shown as "end view" of a wire (signal conductor) but it is understood that wiring on wiring level 118 could be running "left/right" instead of "into the paper". Generally, alternating wiring levels have orthogonal wiring. Occasionally, short "wrong way" wires are used, that is, on a wiring level generally having "east/west" wiring, there may be some short "north/south" wires.

Figure 3B:
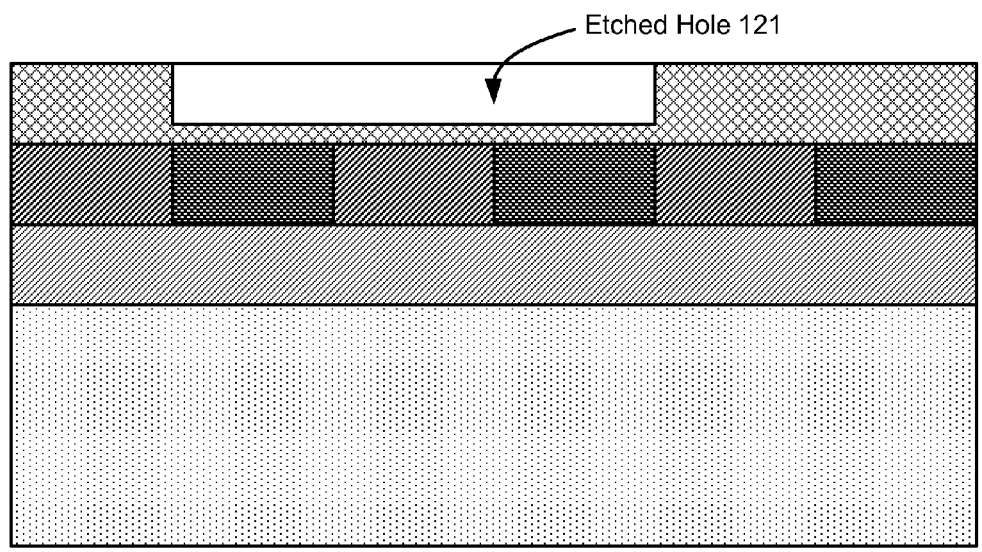

FIG. 3B shows etched hole 121 created, being etched part way through dielectric level 120 (referenced in FIG. 3A). A timed etch determines depth of etched hole 121.

Reference numbers on subsequent figures will, for simplicity, generally not be carried forward to subsequent process steps unless an item is specifically referred to in discussion of a figure. Also, there are often pluralities of a particular item, such as buffer 143 (FIG. 4C) which shows buffers 143A, 143B, 143C, and 143D. Unless a particular such item is being specifically discussed, such items may be generically referred to by their reference number without a suffix, such as "buffer 143".

FIG. 3C shows a conformal growth of suitably lightly doped polycrystalline P− silicon 122 conformally deposited over a top surface of dielectric level 120 and into etched hole 121. P− silicon 122 may be conformally deposited, for example, using a low pressure, low bias CVD (Chemical Vapor Deposition) at approximately 0.1 atmosphere and approximately 100 v deposition bias, using, for example, SiF4 (silicon tetrafluoride). The relatively low pressure and bias result in a relatively slow (hours) deposition but produce a more mono-crystalline silicon deposition than higher-bias, higher-voltage deposition used, for example, to make polysilicon conductors. One or more annealing steps may be used to make P− silicon 122 more monocrystalline. Whereas a P− silicon 122 deposition is described to teach creation of NFETs (N channel Field Effect Transistors), a similar deposition, using N− silicon deposition may be used to create PFETs (P channel Field Effect Transistors).

Figure 5:
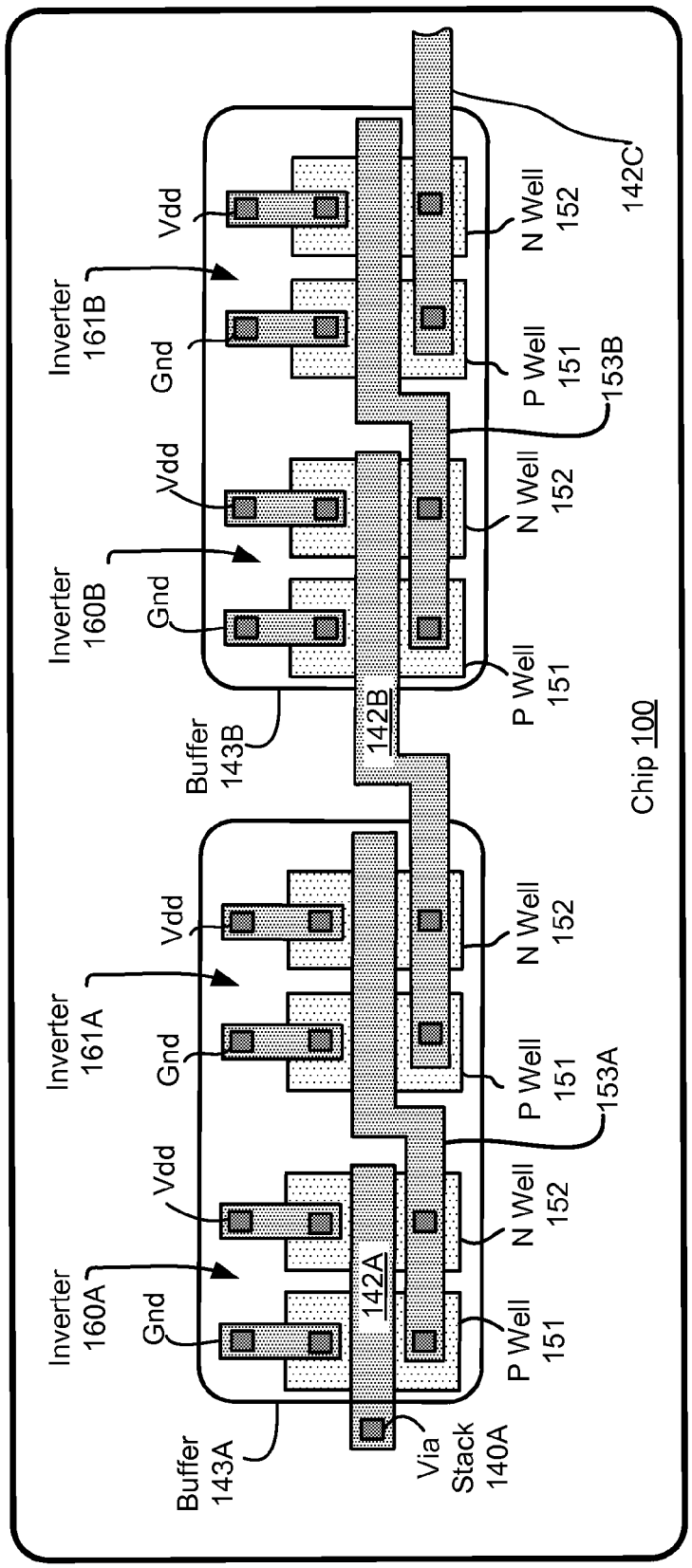
FIG. 5 shows an exemplary circuit layout of two buffer circuits in the global wiring region and shown schematically in FIG. 4C.

FIG. 3D shows silicon chip 100 after planarization (e.g., chemical-mechanical polishing) which removes the P− silicon 122 (FIG. 3C) except remaining P− silicon 122 in etched hole 121, the remaining portion of P− silicon 122 being called P well 151. In a similar manner, one or more N wells 152 (shown in FIG. 5) are created. NFETs are created in P wells 151; PFETs are created in N wells 152 (FIG. 5).

FIGS. 3M and 3N show an alternative way to make P well 151 (and, using suitable doping, N well 152). In FIG. 3M, a thin polycrystalline conformal deposition P− 122 is deposited. In FIG. 3M, P− silicon 122 is thinner than etched hole 121 is deep. A P− epitaxial layer 180 is grown on top of P− silicon 122. P− epitaxial layer 180 is grown thick enough to extend above the top surface of dielectric level 120 over etched hole 121. FIG. 3N shows the structure of FIG. 3M after planarization (e.g., chemical-mechanical polishing) to remove P− silicon 122 and P− epitaxial layer 180 except in etched hole 121.

FIG. 3E shows silicon chip 100 of FIG. 3D (or FIG. 3N) after deposition of a gate dielectric 123. Gate dielectric 123 may be SiO2 or other suitable gate dielectric such as a high-K dielectric.

FIG. 3F shows silicon chip 100 of FIG. 3E after creation of a gate electrode 124, created, for example, by deposition of a metal (or polysilicon) and etching off the metal (or polysilicon) except for gate electrode 124 as shown.

FIG. 3G shows silicon chip 100 of FIG. 3F after conformal deposition of a spacer oxide 125. Spacer oxide 125 may be, for example, SiO2. Not all processes require a spacer oxide 125, but spacer oxide is shown herein for completeness.

FIG. 3H shows silicon chip 100 of FIG. 3G following an anisotropic etch of spacer oxide 125 and gate dielectric 123, leaving portions of spacer oxide 125 on vertical edges of gate electrode 124 as shown. Gate dielectric 123 has been removed except under the remaining spacer oxide 125. Note that the dielectric level 120 will be attacked by the anisotropic etch as there is no etch stop on a top surface of dielectric level 120 as shown. This is not a problem for reasonable durations of the anisotropic etch, as additional dielectric material will be deposited later (dielectric 127, see FIG. 3K). If a particular process requires an etch stop, a top surface of dielectric level 120 could be covered with silicon nitride (Si3N4) to serve as an etch stop.

FIG. 3I shows silicon chip 100 of FIG. 3H receiving an N+ implant to create source/drain areas, shown as source/drain 137, in P well 151 (P well 151 shown in FIG. 3D), leaving P− silicon 138 under gate electrode 124. Gate electrode 124 and the remaining spacer oxide 125 mask the N+ implant to leave the P− silicon 138, suitable for an FET body, under gate electrode 124. This is, therefore, a self-aligned implant, leaving a small and predictable overlap capacitance between gate electrode 124 and the source/drain 137. Small overlap capacitance is extremely desirable in high speed logic switching circuits, as any overlap capacitance between gate electrode 124 and the drain (whichever of source/drain 137 is a drain at the time) of the FET is "Miller capacitance", that is, the effective value of the gate-drain overlap capacitance is multiplied by a voltage gain of the FET, the voltage gain being relatively large, such as ten or higher.

FIG. 3J shows silicon chip 100 of FIG. 3I after growth of silicide 126 over the source/drain regions 137. Silicide 126 is grown in a conventional manner, such as deposition of titanium, heating silicon chip 100 for form titanium silicide, and removal of titanium not thus silicided.

Figure 3K:
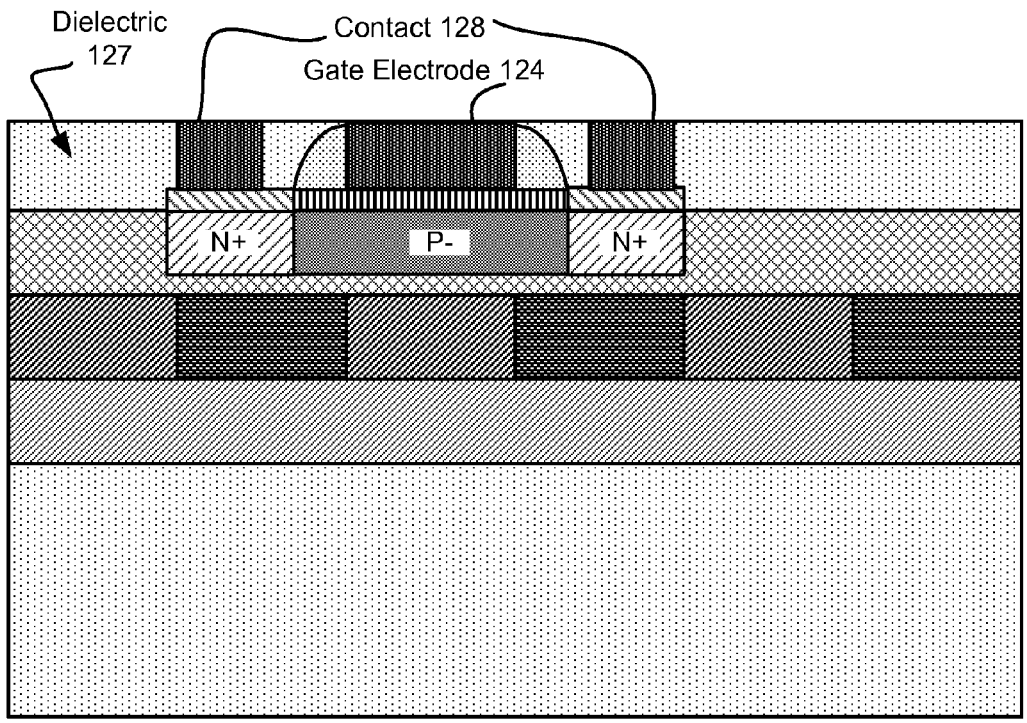
Figure 3L:
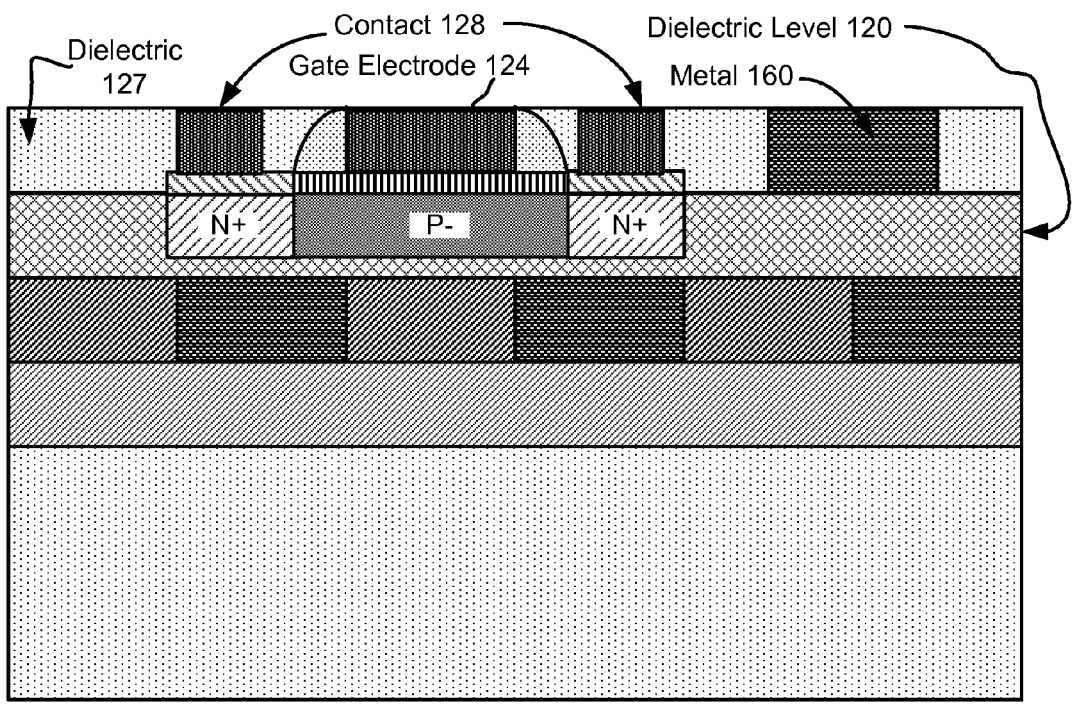

FIGS. 3K and 3L show minor variants of embodiments of the invention in processing steps following silicon chip 100 as shown in FIG. 3J. In FIG. 3K, dielectric 127 is deposited and contacts 128 are etched open and then filled with, for example, tungsten, so that the source and the drain of the NFET can be connected to signals, Gnd, or Vdd. Gate electrode 124 is connected to a signal in a conventional manner (see FIG. 5, e.g.).

FIG. 3L shows that wiring conductors may be included in dielectric 127, shown as metal 160. For example, metal 160 may be deposited and etched to desired wiring shapes on dielectric level 120, dielectric 127 may be deposited, and silicon chip 100 then planarized (e.g., by chemical-mechanical polishing) to expose a top surface of metal 160, as well as top surfaces of contacts 128. Note that, as shown, metal 160 appears as an "end view" of a signal conductor; the three "metals" on wiring level 118 below also show up as "end views". Normally, metal wiring direction alternates between wiring levels. It will be understood that wiring direction on wiring level 118 is shown with "end view" wires for clarity that it is a wiring level; actual wiring on wiring level 118 may be in fact be routed "left to right" instead of "into the paper". Alternatively, metal 160 may simply be a short "wrong way" wiring section as shown. "End view" metal wiring is shown to indicate that the level comprises wiring, not necessarily the direction of wiring on any particular wiring level.

Figure 4A:
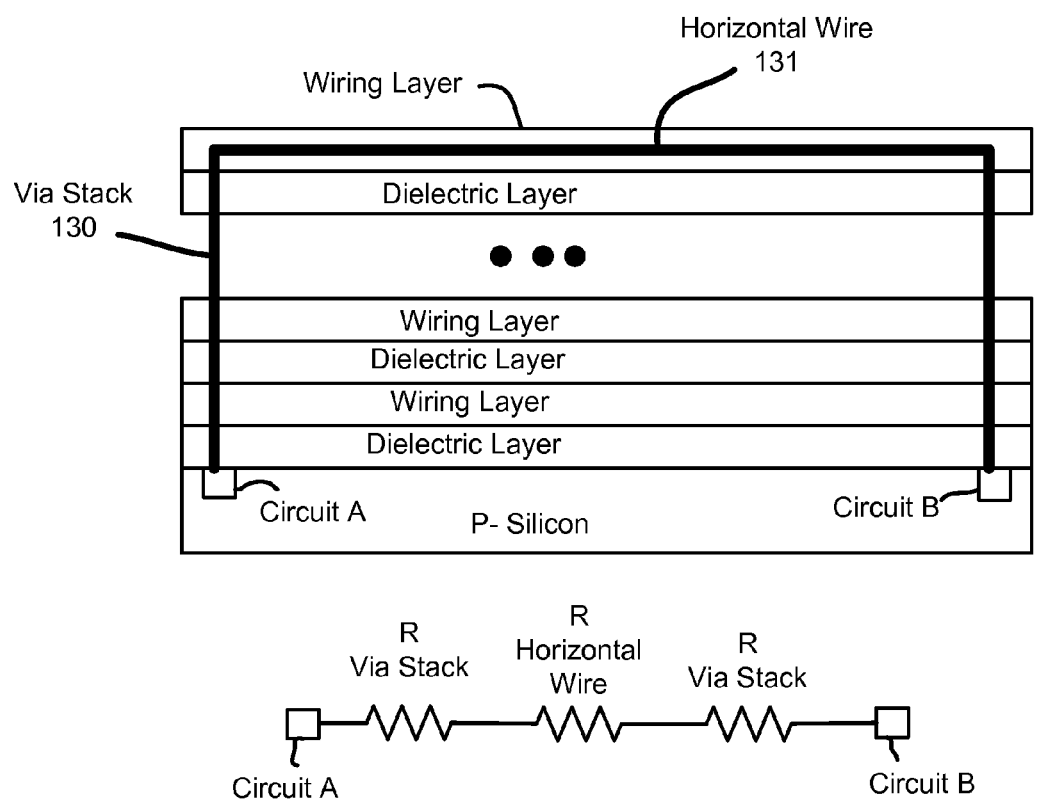
FIG. 4A shows a prior art wiring from a first circuit to a second circuit with no buffer circuits. An electrical schematic is included to show resistances through which a signal driven by the first circuit must travel on the way to the second circuit.

FIG. 4A is a prior art drawing of a cross section of a semiconductor chip. A circuit A drives a signal to a circuit B. The signal must pass through a number of vias in via stack 130, continuing through horizontal wire 131, and pass down through a number of vias in a via stack similar to via stack 130 to reach an input of circuit B. An electrical schematic is included in FIG. 4A. When circuit A and circuit B are, for example, ten millimeters (10 mm) apart on the silicon chip, horizontal wire 131's "R Horizontal Wire" may be quite large, and distributed capacitance may also be quite large, causing large delay and unacceptable signal degradation (see FIG. 4D).

Figure 4B:
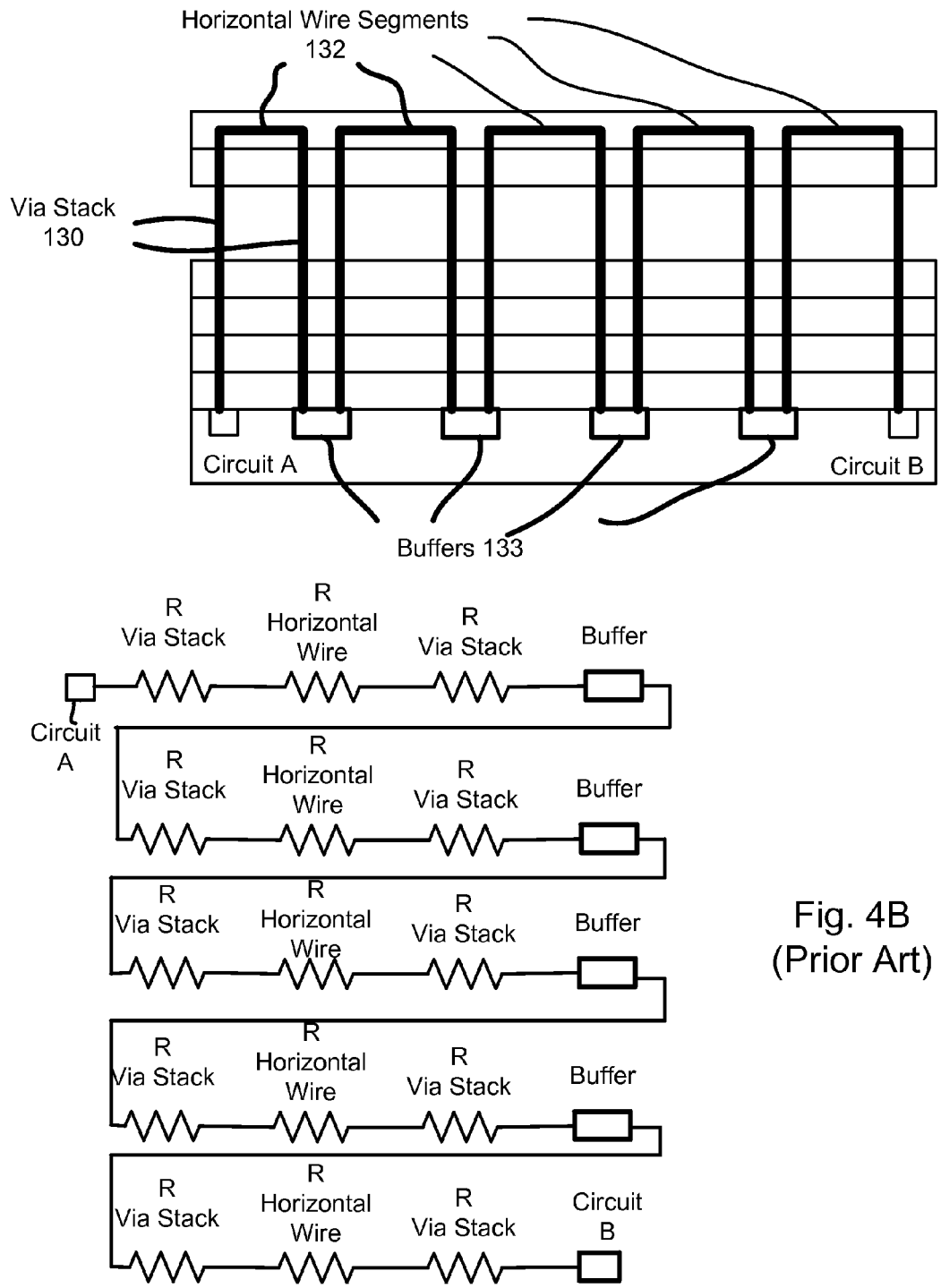
FIG. 4B shows a prior art wiring and buffer circuit arrangement between a first circuit and a second circuit in which all the buffer circuits are conventional buffer circuits on the silicon substrate. Included are an electrical schematic showing resistors and buffers through which the signal sent from the first circuit must pass on the way to the second circuit.

FIG. 4B is a prior art drawing of a cross section of a semiconductor chip. As with FIG. 4A, a circuit A drives a signal to a circuit B, but, in FIG. 4B, the signal is periodically re-powered through buffers 133 as shown. As described earlier, via stacks 130 have relatively high resistance; perhaps 400 ohms to an $8^{th}$ level of wiring, and therefore are major contributors to resistance-capacitance signal delay and signal degradation. FIG. 4B includes a circuit schematic of the signal path from circuit A to circuit B. Only four buffers 133 are shown; however, if a signal must be sent for 10 millimeters, a designer may be forced to use more buffers 133, for example, one buffer 133 may be needed every 500 microns. Representative voltage waveforms are shown in FIG. 4E. The ten via stacks 130 also create wiring congestion in wiring levels one to seven as the via stacks 130 use up one or more wiring tracks on each wiring level.

Figure 4C:
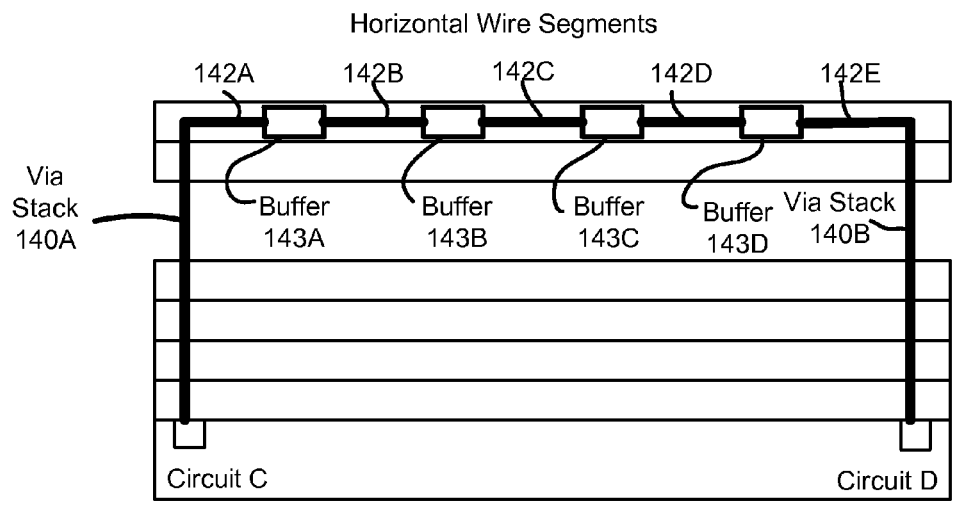
FIG. 4C shows a wiring and buffer circuit arrangement according to an embodiment of the invention in which one or more buffer circuits are created in a dielectric layer in the global wiring region of a semiconductor chip.
Figure 4C:
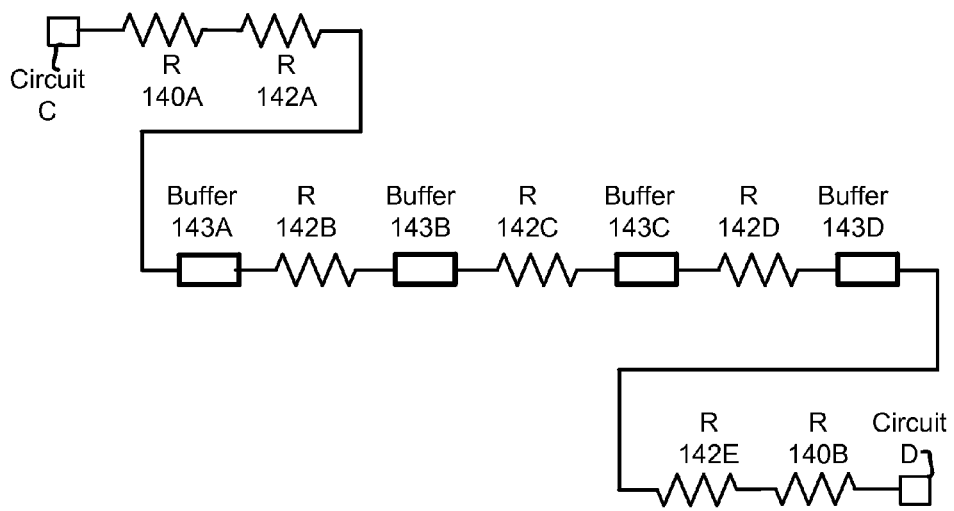

FIG. 4C shows a cross section of semiconductor chip 100 in which a circuit C has to transmit a signal to a circuit D. The signal goes up through via stack 140A, and may be routed on a horizontal wiring segment 142A. The signal is then buffered by buffer 143A. The signal continues through horizontal wiring segment 142B, buffer 143B, horizontal wiring segment 142C, buffer 143C, horizontal wiring segment 142D, buffer 143D, horizontal wiring segment 142E, and down via stack 140B en route to circuit D. A circuit schematic of this path is included in FIG. 4C. Note that only two via stacks are needed; horizontal wires 142A and 142E can be kept short using suitable placements of buffers 143A and 143D so that no resistance in the signal's path needs to be significantly larger than one via stack 140, which is on the order of 400 ohms, assuming, again, that the stack extends up to an $8^{th}$ wiring level.

FIGS. 4D, 4E, and 4F, respectively show waveforms typical for the wiring arrangements shown in FIGS. 4A, 4B, and 4C.

FIG. 4D shows typical waveforms for a long, unbuffered, signal path. An output of circuit A is severely degraded; the signal at an input to circuit B is a very slow ramp that lags behind the output of circuit A by a significant amount of time. Circuit B does not switch until the signal at the input to circuit B reaches a switching threshold of circuit B. Variations in resistances and capacitances, as well as normal variations in the switching threshold of circuit B cause very large variations in when the output of circuit B changes from a logic "1" to a logic "0" or form a logic "0" to a logic "1".

FIG. 4E shows typical waveforms for a long, conventionally buffered, signal path as shown in FIG. 4B. Although the waveforms are not as degraded as the waveforms shown in FIG. 4D, there is far more resistance in the total path, as well as additional capacitance associated with the via stacks themselves. There are also delays of the buffers themselves. FIG. 4E shows the output of circuit B actually switching later than in the waveforms of FIG. 4D. Depending on particular layouts and wiring levels used, the output of circuit B of FIG. 4E may switch earlier or later than the output of circuit B of FIG. 4D.

FIG. 4F shows typical waveforms for the circuitry shown in FIG. 4C. Via stack resistances have been eliminated, except at a beginning and an end of the signal path. Total capacitance is approximately the same as in the circuitry of FIG. 4A, with the small addition of the capacitance associated with buffer circuits 143A, 143B, 143C, and 143D. Waveforms (output of circuit C, output of 403A, output of 403B, output of 403C, output of 403D, and input to circuit D) are much steeper (i.e., dV/dt is larger) than in FIG. 4D, which reduces timing uncertainty associated with switching threshold voltages.

FIG. 5 shows a top view of an exemplary layout of a portion of the circuitry of FIG. 4C. Via stack 140A is a via stack that brings a signal driven from circuit C (FIG. 4C) to the wiring level upon which a long horizontal signal route is to be placed (e.g., the $8^{th}$ wiring level). Horizontal wiring segment 142A, shown schematically in FIG. 4C, connects via stack 140A to a first inverter 160A in buffer 143A. The first inverter 160A in buffer 143A comprises a first NFET in a first P well 151 and a first PFET in a first N well 152. Sources of the first NFET and the first PFET are connected to Gnd and Vdd respectively. Drains of the first NFET and the first PFET are connected together by signal 153A to a second inverter 161A in buffer 143A. The second inverter 161A comprises a second P well 151 for a second NFET and a second N well 152 for a second PFET. Sources of the second NFET and the second PFET are connected to Gnd and Vdd respectively. An output of buffer 143A is connected to drains of the second NFET and the second PFET on horizontal wiring segment 142B, which is shown driving buffer 143B which is designed similarly to buffer 143A (i.e., having two inverters, 160B and 161B). Buffer 143B has an output driving horizontal wiring segment 142C. Additional buffers as shown schematically in FIG. 4C further buffer the signal and via stack 140B brings the signal back down to drive circuit D (FIG. 4C).

Layout of buffers 143 (143A, 143B) in FIG. 5 show the first inverter 160 in each buffer 143 to be the same design as the second inverter 161 in the same buffer 143. In practice, the first inverter 160 may be different than the second inverter 161. For example, the first inverter 160 may have significantly smaller FET width/length ratios than the second inverter 161, as the first inverter 160 may be designed to have a lower gate capacitance than the second inverter 161; also, the second inverter 161 typically needs to drive a much larger capacitive load (e.g., a horizontal wiring segment and an input to the next buffer), whereas the first inverter 160 only needs to drive the second inverter 161. For these reasons, the second inverter 161 width/length ratio may be three to ten times (or more) larger than the width to length ratio of the first inverter 160 in buffer 143. It will also be understood that buffers 143 may be inverting buffers, having only one inverter per buffer 143, in which case a designer must account for a phase inversion between circuit C and circuit D when an odd number of buffers 143 are used between circuit C and circuit D.

FETs created in the process described are generally poorer than FETs created in Si substrate 110. For example, in a modern semiconductor technology, the FETs created in BEOL 105 as described herein may have approximately 200 uA/um capability, whereas a FET created in Si substrate 110 may have approximately six times that capability. However, far fewer FETs (only in buffers 143) would likely be created in BEOL 105 and FETs created in BEOL 105 can therefore be made relatively wide with minimal cost. For example, an inverter, such as an inverter 161 shown in FIG. 5, having a width of 20 um and driving a horizontal wiring segment 142 shown in FIG. 5 of 500 um would need to drive approximately 100 fF capacitance and would have a rise time in the tens of ps (picoseconds).

For simplicity, buffers shown are constructed with inverters. In general, most buffers are built with one or two inverters, merely repowering a signal en route to a target circuit. However, it will be appreciated that, using NFETs and PFETs as taught herein, a buffer be a multi-input logic circuit. For example, a buffer could include one or more inputs besides the signal that is being sent as described above. For example, two NFETs, connected in series and connected in a conventional manner with two PFETs, connected in parallel would be a NAND gate, a second signal to the NAND gate thereby being logically combined with the signal being repowered.

What is claimed is:

1. A method for creating a self aligned FET in a back end of the line (BEOL) region of a semiconductor chip comprising the steps of:

creating an etched hole in a dielectric layer between a first wiring plane and a second wiring plane in the BEOL, the etched hole extending part way but not entirely through the dielectric layer between the first wiring plane and the second wiring plane in the BEOL;

depositing a conformal layer of silicon on the dielectric level and the etched hole;

planarizing the semiconductor chip to remove the conformal layer of silicon except for a portion of the conformal layer in the etched hole, thereby creating a well of silicon;

depositing a gate dielectric on the dielectric layer and the well of silicon;

creating a gate electrode directly over a portion of the well of silicon;

depositing a spacer oxide over the gate dielectric and the gate electrode;

anisotropically etching the spacer oxide and the gate dielectric to expose the well of silicon except for areas of the well of silicon covered by the gate electrode and portions of the spacer oxide remaining after the anisotropic etch; and implanting the exposed portions of the well of silicon to create source/drain regions, thereby creating the self aligned FET.

2. The method of claim 1, wherein the well of silicon is doped P−.

3. The method of claim 1, wherein the well of silicon is doped N−.

4. The method of claim 1, wherein creating the etched hole in the dielectric layer in the BEOL comprises using a timed etch in the dielectric layer.

5. The method of claim 1, further comprising growing an epitaxial layer over the conformal layer of silicon over the dielectric level.

* * * * *